United States Patent
Salessi et al.

(10) Patent No.: US 7,903,474 B2
(45) Date of Patent: *Mar. 8, 2011

(54) REDUNDANT PURGE FOR FLASH STORAGE DEVICE

(75) Inventors: Nader Salessi, Laguna Niguel, CA (US); Hooshmand Torabi, Irvine, CA (US); Chak-Fai Cheng, Huntington Beach, CA (US); Hosein Gazeri, Irvine, CA (US); Richard Mataya, Rancho Santa Margarita, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/384,908

(22) Filed: Apr. 11, 2009

(65) Prior Publication Data
US 2009/0204749 A1  Aug. 13, 2009

Related U.S. Application Data

(63) Continuation of application No. 12/286,763, filed on Oct. 1, 2008, which is a continuation of application No. 11/582,783, filed on Oct. 17, 2006, now Pat. No. 7,450,436.

(60) Provisional application No. 60/727,716, filed on Oct. 17, 2005.

(51) Int. Cl.
*G11C 16/04* (2006.01)

(52) U.S. Cl. .......... 365/185.33; 365/185.11; 365/185.28; 365/185.29

(58) Field of Classification Search .............. 365/185.11, 365/185.28, 185.29, 185.33
See application file for complete search history.

(56) References Cited

U.S. PATENT DOCUMENTS

| | | | |
|---|---|---|---|
| 6,804,151 B2 | 10/2004 | Iijima | |
| 2003/0037295 A1 | 2/2003 | Galzur et al. | |
| 2003/0225962 A1* | 12/2003 | Hirosawa | 711/103 |
| 2006/0117393 A1* | 6/2006 | Merry et al. | 726/34 |
| 2006/0245272 A1 | 11/2006 | Hartono et al. | |

* cited by examiner

*Primary Examiner* — Hoai V Ho
(74) *Attorney, Agent, or Firm* — McDermott Will & Emery LLP

(57) ABSTRACT

A flash storage device includes flash storage units that are purged in response to a condition or command. A flash controller interface receives a command for purging the flash storage device and provides a purge command to flash controllers in the flash storage device. Alternatively, the flash storage device detects a condition in response to which the flash controller interface provides a purge command to the flash controllers. Each flash controller independently erases a flash storage unit in response to receiving the purge command, by writing a pattern of data to the flash storage unit, such that the flash storage units are purged substantially in parallel with each other.

14 Claims, 6 Drawing Sheets

REDUNDANT PURGE FOR FLASH STORAGE DEVICE

CROSS-REFERENCE TO RELATED APPLICATIONS

This application is a continuation of U.S. patent application Ser. No. 12/286,763 filed Oct. 1, 2008, and entitled "Enhanced Erase for Flash Storage Device," which is a continuation of U.S. patent application Ser. No. 11/582,783 filed Oct. 17, 2006, and entitled "Device Recoverable Purge For Flash Storage Device," now U.S. patent Ser. No. 7,450,436, which claims benefit of U.S. Provisional Patent Application No. 60/727,716 filed Oct. 17, 2005, and entitled "System and Method for Purge of Memory Device," wherein all of the foregoing are herein incorporated by reference in their entirety.

BACKGROUND

1. Field of Invention

The present invention generally relates to flash storage devices. More particularly, the present invention relates to a system and method of erasing or purging data in a flash storage device.

2. Description of Related Art

Flash storage devices have become the preferred technology for many applications in recent years. The ability to store large amounts of data and to withstand harsh operating environments, together with the non-volatile nature of the storage, makes these flash storage devices appealing for many applications. In some applications, flash storage devices are used to store highly sensitive data, which may need to be protected from unauthorized access at any time.

In many applications, it would be beneficial for the data in the flash storage device to be erased or purged effectively and quickly thus forbidding unauthorized subsequent access to the device. Depending on the application, the flash storage device, and the type of security risk or condition, a different type of purge may be required. In some applications, it would be advantageous to verify the purge of the flash storage device. In light of the above, a need exists for a system and method of purging data from a flash storage device.

SUMMARY

In various embodiments, a flash storage device includes a flash controller interface, flash storage controllers, and flash storage units. The flash controller interface receives a command for purging the flash storage device and, in response to receiving the command, provides a command to each flash controller. Each flash controller erases a flash storage unit in response to receiving the command from the flash controller interface such that the flash storage units are erased substantially in parallel with each other. Erasing the flash storage units substantially in parallel reduces the time for purging the flash storage device.

A method for purging a flash storage device comprising a plurality of flash storage units, in accordance with one embodiment, includes receiving a command. The method further comprises erasing the plurality of flash storage units substantially in parallel in response to receiving the command.

A system, in accordance with one embodiment, comprises flash storage controllers and flash storage units. Each flash storage controller corresponds to one of the flash storage units and is coupled in communication with that flash storage unit. The flash storage controllers are configured to receive a command and to erase the flash storage units substantially in parallel in response to receiving the command.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DESCRIPTION

In various embodiments, flash storage units in a flash storage device are erased substantially in parallel in response to a command received by the flash storage device. In some embodiments, all flash storage blocks in the flash storage units are erased to purge the flash storage device. In other embodiments, data blocks, control blocks, defective blocks, and spare blocks among the flash storage blocks in the flash storage units are selectively erased to purge the flash storage device.

Figure 1:
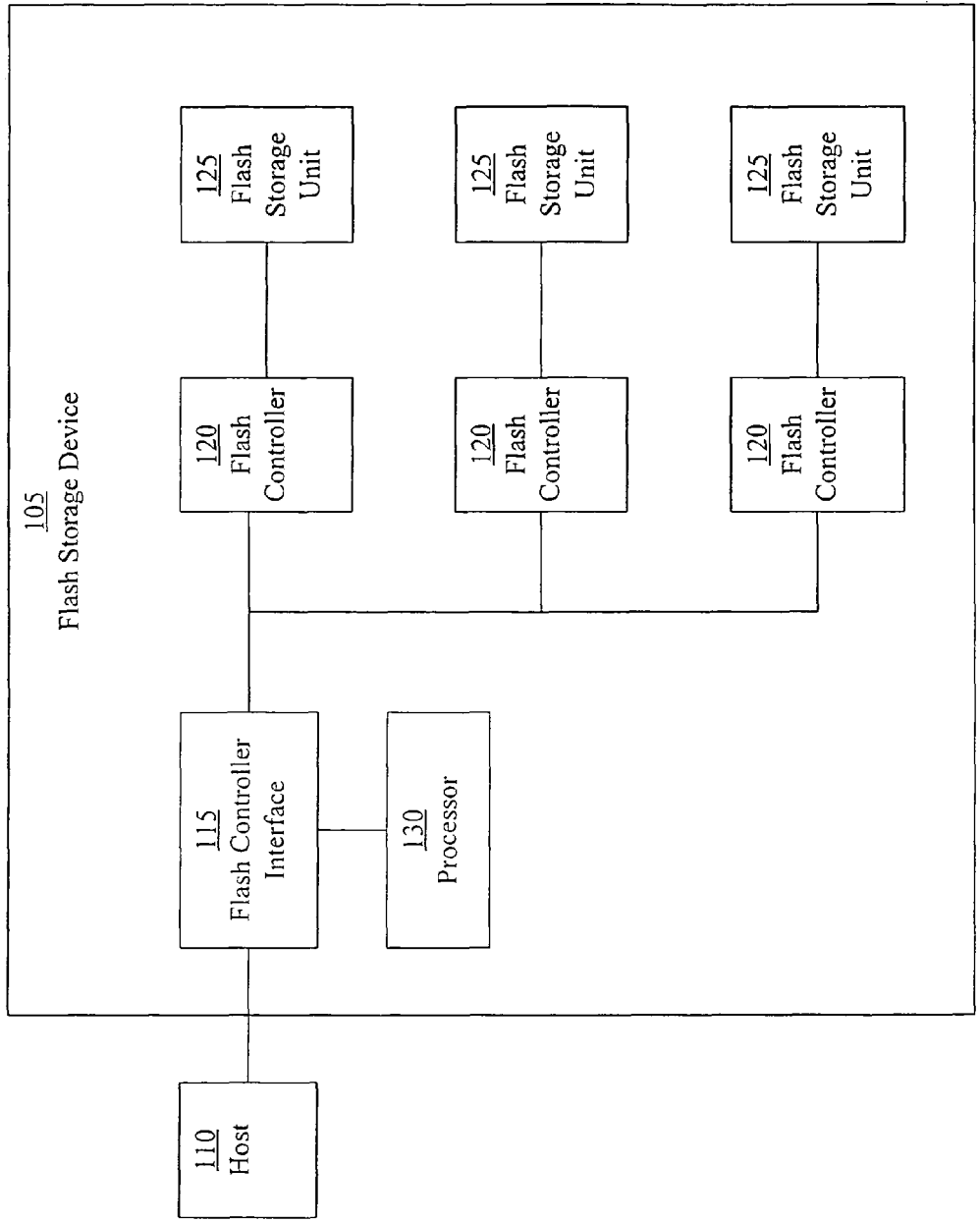
FIG. 1 is a block diagram of a flash storage device, in accordance with one embodiment.

FIG. 1 illustrates a flash storage device 105, in accordance with one embodiment. The flash storage device 105 is coupled in communication with a host 110. The flash storage device 105 may be any flash storage device, for example a CompactFlash card, a Secure Digital (SD) card, a Universal Serial Bus (USB) memory stick, a solid state drive, or the like. The host 110 may be any computing device, such as a personal computer, a portable computer, a personal digital assistant (PDA), a digital camera, or any electronic equipment capable of utilizing the flash storage device 105.

The flash storage device 105 includes a flash controller interface 115, a processor 130, flash controllers 120, and flash storage units 125. The flash controller interface 115 is coupled in communication with the host 110, the processor 130, and the flash controllers 120. Each flash controller 120 is coupled in communication with a corresponding flash storage unit 125. Each of the flash storage units 125 includes a non-volatile memory, such as a flash memory, for storing data. Although three flash controllers 120 and three flash storage units 125 are shown in FIG. 1, the flash storage device 105 can have more or fewer flash controllers 120 or flash storage units 125 in other embodiments. In some embodiments, a flash storage controller 120 may be coupled in communication with more than one flash storage unit 125. In other embodiments, the flash storage device 105 comprises non-flash storage in addition to the flash storage units 125.

The flash controller interface 115 receives commands from the host 110 and provides commands to the flash controllers 120 based on the commands received from the host 110. Each of the flash controllers 120 receives commands from the flash controller interface 115 and processes the commands to access the flash storage unit 125 corresponding to the flash controller 120. Additionally, the flash controller interface 115 provides commands received from the host 110 to the processor 130. The processor 130 processes the commands received from the flash controller interface 115, generates commands based on the commands received from the flash controller interface 115, and provides the generated commands to the flash controller interface 115. In turn, the flash controller interface 115 provides the commands generated by the processor 130 to the flash controllers 120, and the flash controllers 120 process the commands to access the flash storage units 125. A command received by the processor 130 from the flash controller interface 115 may be a command for purging the flash storage device 105 or a command indicating that security of the flash storage device 105 may be at risk. For example, the command may be an access command for authenticating access to the storage device 105 which indicates that incorrect passwords have been repeatedly supplied in previous access commands.

In one embodiment, the flash controller interface 115 receives a command from the host 110 for purging the flash storage device 105 and passes the command to each flash controller 120. In turn, each flash controller 120 erases the flash storage unit 125 corresponding to the flash controller 120 in response to receiving the command. In this embodiment, the flash controllers 120 operate substantially in parallel with each other to erase the flash storage units 125 substantially in parallel with each other. In this way, the flash storage units 125 can be quickly erased because one flash storage unit 125 need not wait for another flash storage unit 125 to complete an erase operation before the one flash storage unit 125 begins an erase operation.

In another embodiment, the flash controller interface 115 receives a command from the host 110 for purging the flash storage device 105. In turn, the flash controller interface 115 passes the command to the processor 130. The processor 130 receives the command from the flash controller interface 115, processes the command received from the flash controller interface 115 to generate a command for erasing the flash storage units 125, and provides the command for erasing the flash storage units 125 to the flash controller interface 115. In turn, the flash controller interface 115 provides the command generated by the processor 130 to each flash controller 120. Each flash controller 120 receives the command from the flash controller interface 115 and processes the command to erase the flash storage unit 125 corresponding to the flash controller 120. Moreover, the flash controllers 120 operate substantially in parallel with each other to erase the flash storage units 125. In one embodiment, the flash storage interface 115 provides the command generated by the processor 130 to each flash controller 120 simultaneously, for example in a broadcast message. In another embodiment, the flash storage interface 115 provides the command generated by the processor 130 to each flash controller 120 individually such that the flash controllers 120 can process the commands substantially in parallel with each other.

In another embodiment, the processor 130 can generate an individual command for each flash controller 120 for erasing the flash storage unit 125 corresponding to the flash controller 120. The processor 130 provides the individual commands to the flash controller interface 115, and the flash controller interface 115 provides the individual commands to the appropriate flash controllers 120. The flash controllers 120 process the individual commands substantially in parallel to erase the flash storage units 125 substantially in parallel with each other. It is to be understood that FIG. 1 is a high level block diagram of the flash storage device, and thus, other components and connections as desired may be utilized which are not depicted in FIG. 1.

Figure 2:
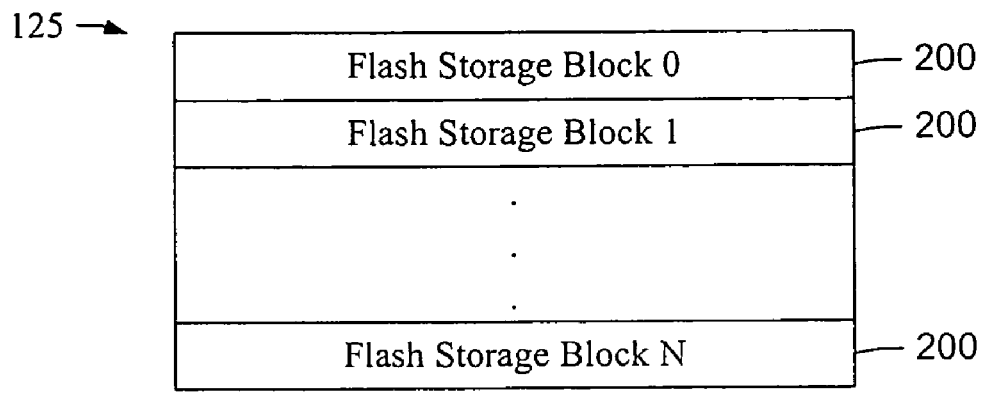
FIG. 2 is a block diagram of a flash storage unit, in accordance with one embodiment.

FIG. 2 illustrates the flash storage unit 125, in accordance with one embodiment. The flash storage unit 125 includes flash storage blocks 200. Each of the flash storage blocks 200 includes locations for storing data. The locations can be data bytes, data bits, words, memory pages, or any other unit of data. For example, the flash storage block 200 may store 16 kilobytes of data or 128 kilobytes of data. The flash controller 120 corresponding to the flash storage unit 125 containing the flash storage block 200 erases the flash storage block 200 as a unit by overwriting data in the flash storage block 200. The flash storage unit 125 may have any number of flash storage blocks 200. It is to be understood that the flash storage unit 125 may have other components not illustrated in FIG. 2.

In one embodiment, the locations in the flash storage block 200 include data bits. The flash controller 120 corresponding to the flash storage unit 125 erases the flash storage block 200 by writing data having a value of zero into each data bit of each location of the flash storage block 200. In another embodiment, the flash controller 120 corresponding to the flash storage unit 125 erases the flash storage block 200 by writing data having a value of one into each data bit of each location of the flash storage block 200. In still another embodiment, the flash controller 120 corresponding to the flash storage unit 125 erases the flash storage block 200 by writing a sequence of data patterns into the locations of the flash storage block 200. For example, each location in the flash storage block 200 can be a data byte having eight data bits, and the data patterns can include the sequence of hexadecimal values 0x00, 0xFF, and 0xA5. Other data patterns having other values may be used in other embodiments.

Figure 3:
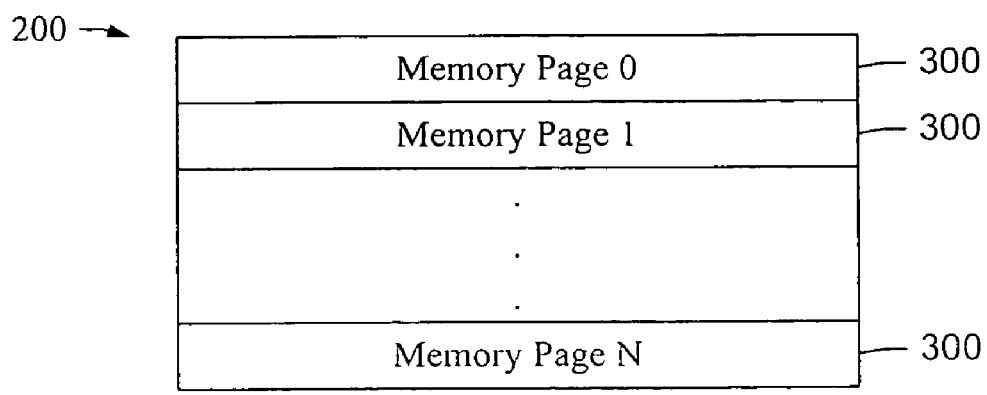
FIG. 3 is a block diagram of a flash storage block, in accordance with one embodiment.

FIG. 3 illustrates the flash storage block 200, in accordance with one embodiment. The flash storage block 200 includes memory pages 300. Each memory page 300 can be a location for storing data in the flash storage block 200 or can include locations for storing data. The flash storage block 200 may include any number of memory pages 300.

Figure 4:
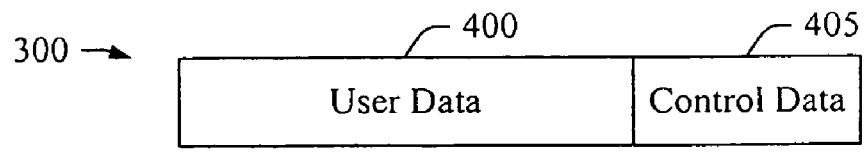
FIG. 4 is a block diagram of a memory page, in accordance with one embodiment.

FIG. 4 illustrates the memory page 300, in accordance with one embodiment. The memory page 300 includes a user data section 400 and a control data section 405. The flash controller 120 corresponding to the flash storage unit 125 containing the memory page 300 writes user data into the user data section 400 and control data into the control data section 405. The user data may be data provided to the flash storage device 105 from the host 110. The control data may include error handling and statistical information for the memory page 300. For example, the control data can include a write count indicating the number of times data is written in the flash storage block 200 containing the memory page 300. The control data may comprise any control data, such as an error correction code (ECC), a defect map, various flags, status indicators, pointers, defect pointers, spare pointers, or the like. The control data may be data generated by the processor 130 or by the flash controller 120 corresponding to the flash storage unit 125 containing the memory page 300 or may be generated by another component of the flash storage device 105. In some embodiments, the memory page 300 may contain user data 400 with no control data 405, while in other embodiments the memory page 300 may contain control data 405 with no user data 400.

Figure 5:
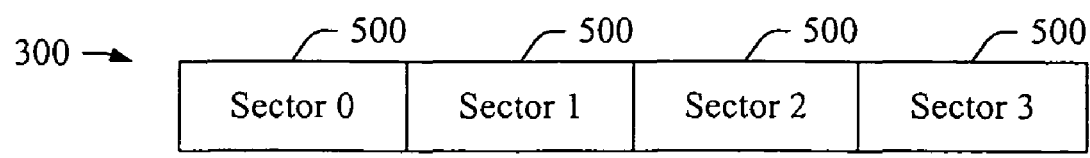
FIG. 5 is a block diagram of a memory page, in accordance with another embodiment.

FIG. 5 illustrates the memory page 300, in accordance with another embodiment. The memory page 300 includes memory sectors (Sectors) 500. Each of the memory sectors 500 may be a location in the memory page 300 for storing data or may include locations for storing data. In one example, the memory sector 500 may store 528 bytes of data, which can include user data and/or control data. The memory sector 500 may store more or fewer data bytes in other embodiments.

Figure 6:
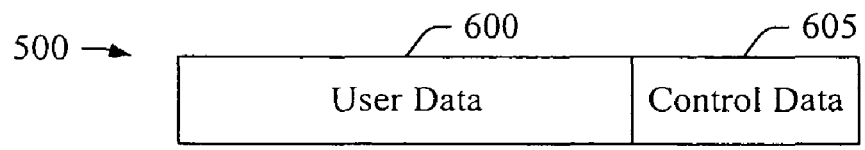
FIG. 6 is a block diagram of a memory sector, in accordance with one embodiment.

FIG. 6 illustrates the memory sector 500, in accordance with one embodiment. The memory sector 500 includes a user data section 600 and a control data section 605. The user data section 600 stores user data, and the control data section 605 stores control data. For example, the user data section 600 may store 512 bytes of user data and the control data section 605 may store 16 bytes of control data. The user data section 600 and the control data section 605 may store more or fewer data bytes in other embodiments. In some embodiments, the memory sector 500 may contain user data 600 with no control data 605, while in other embodiments the memory sector 500 may contain control data 605 with no user data 600.

Figure 7:
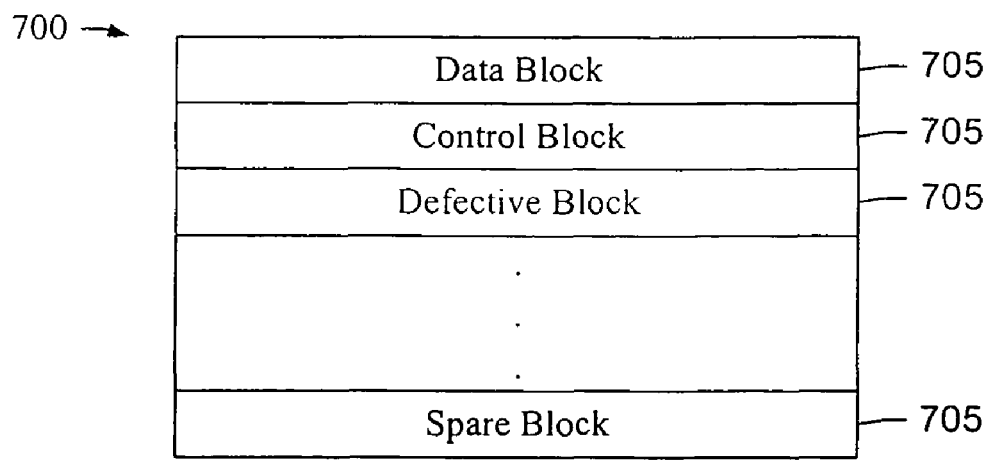
FIG. 7 is block diagram of a block status table, in accordance with one embodiment.

FIG. 7 illustrates a block status table 700, in accordance with one embodiment. In one embodiment, the flash controller 120 corresponding to a flash storage unit 125 generates the block status table 700 for the flash storage unit 125 and writes the block status table 700 into the flash storage unit 125. In turn, the flash storage unit 125 stores the block status table 700. The block status table 700 includes a status 705 for each flash storage block 200 in the flash storage unit 125. The status 705 of a flash storage block 200 indicates the status of the data block such as whether the flash storage block 200 is a data block, a control block, a defective block, or a spare block. A data block is a flash storage block 200 that is used to store user data. For example a data block stores data provided to the flash storage device 105 from the host 110. A control block is a flash storage block 200 that is used to store control data for the flash storage unit 125. For example, a control block can store the block status table 700 of the flash storage unit 125. A defective block is a flash storage block 200 that is deemed not to be functioning properly. A defective block in a flash storage unit 125 can be identified during the manufacturing of the flash storage unit 125, identified during operation of the flash storage device 105, or identified at another time. Additionally, the flash controller 120 corresponding to the flash storage unit 125 can identify a defective block during initialization of the flash storage unit 125 or during operation of the flash storage device 105. A spare block is a flash storage block 200 in a flash storage unit 125 that is used for the purpose of replacing another block, such as a defective block in the flash storage unit 125, or a block being re-written or moved.

Figure 8:
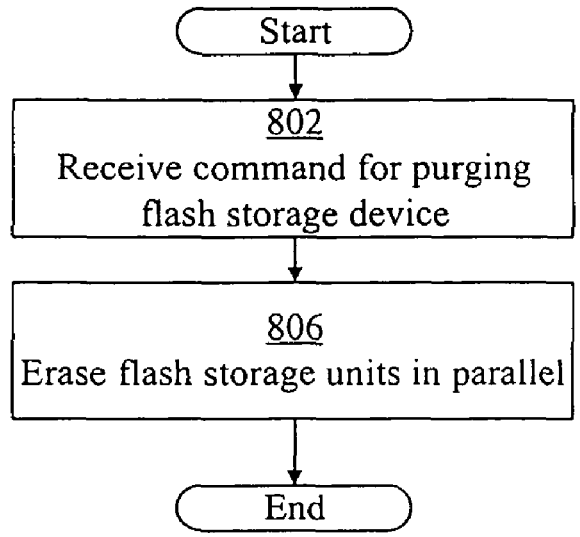
FIG. 8 is a flow chart for a method of purging the flash storage device, in accordance with one embodiment.

FIG. 8 illustrates a method 800 of purging the flash storage device 105, in accordance with one embodiment. In step 802, the flash storage device 105 receives a command for purging the flash storage device 105. The flash storage device 105 may receive the command for purging the flash storage device 105 from the host 110. In one embodiment, the flash controller interface 115 receives the command for purging the flash storage device 105 from the host 110 and passes the command to each flash controller 120.

In another embodiment, the processor 130 generates the command based on certain conditions of the flash storage device 105, such as conditions indicating that security of the flash storage device 105 may be at risk or other conditions. The conditions may be internal or external of the flash storage device 105. Examples of conditions include a change or drop in altitude, a change in an environmental value, failure of a component, power reduction or loss, a physical breach of the flash storage device 105, digital or software breach of the flash storage device 105, or any other condition affecting the flash storage device 105. In some instances, a condition may be a certain time, time interval, or date when it is desirable for a purge. A condition may also be prompted by a user of the host 110, a user of the flash storage device 105, or another input by a user. The processor 130 provides the command to the flash controller interface 115, and flash controller interface 115 passes the command to each flash storage controller 120.

In another embodiment, the flash controller interface 115 receives the command for purging the flash storage device 105 from the host 110 and provides the command to the processor 130. In response to receiving the command from the flash controller interface 115, the processor 130 generates a command for erasing the flash storage units 125. For example, the processor 130 can generate the command for erasing the flash storage units 125 by translating or modifying the command for purging the flash storage device 105 received from the flash controller interface 115. The processor 130 then provides the command for erasing the flash storage units 125 to the flash controller interface 115, and the flash controller interface 115 provides the command for erasing the flash storage units 125 to each flash controller 120. In this way, each flash controller 120 receives a command from the flash controller interface 115 for erasing the flash storage unit 125 corresponding to the flash controller 120.

In another embodiment, the processor 130 generates an individual command for each flash storage unit 125 for erasing that flash storage unit 125. The processor 130 provides the commands to the flash controller interface 115, and the flash controller interface 115 provides each command to the appropriate flash controller 120. In this way, each flash controller 120 receives a command from the flash controller interface 115 for erasing the flash storage unit 125 corresponding to the flash controller 120. The method 800 then proceeds to step 806.

In step 806, the flash storage units 125 are erased substantially in parallel. In one embodiment, each flash controller 120 erases the flash storage unit 125 corresponding to the flash controller 120 in response to receiving the command for purging the flash storage device 105 from the flash controller interface 115. In another embodiment, each flash controller 120 erases the flash storage unit 125 corresponding to the flash controller 120 in response to receiving a command for erasing the flash storage unit 125 from the flash controller interface 115. The flash controllers 120 erase the flash storage units 125 by writing data into locations of the flash storage blocks 200 in the flash storage units 125 to overwrite data stored in the flash storage blocks 200. In another embodiment, the flash controllers 120 erase the flash storage units 125 by using erase commands, or similar commands, associated with the flash storage blocks 200 in the flash storage units 125 to overwrite data stored in the flash storage blocks 200. It is to be understood that the role of the flash controller interface 115 may vary depending on the embodiment, and some embodiments may operate without the use of the flash controller interface 115.

In various embodiments, the flash controllers 120 write data into data blocks, control blocks, defective blocks, spare blocks, or any combination thereof among the flash storage blocks 200 in the flash storage unit 125. Moreover, each flash controller 120 can write data into data blocks, control blocks, defective blocks, or spare blocks of the corresponding flash storage unit 125 in any order, such as by location or type of flash storage block 200. For example, the flash storage controller 120 can first write data into the data blocks of the corresponding flash storage unit 125 and then write data into the control blocks of the corresponding flash storage unit 125. In some embodiments, each flash controller 120 also generates the block status table 700 for the flash storage unit 125 corresponding to the flash controller 120 after erasing the flash storage unit 125. The method 800 then ends.

Figure 9:
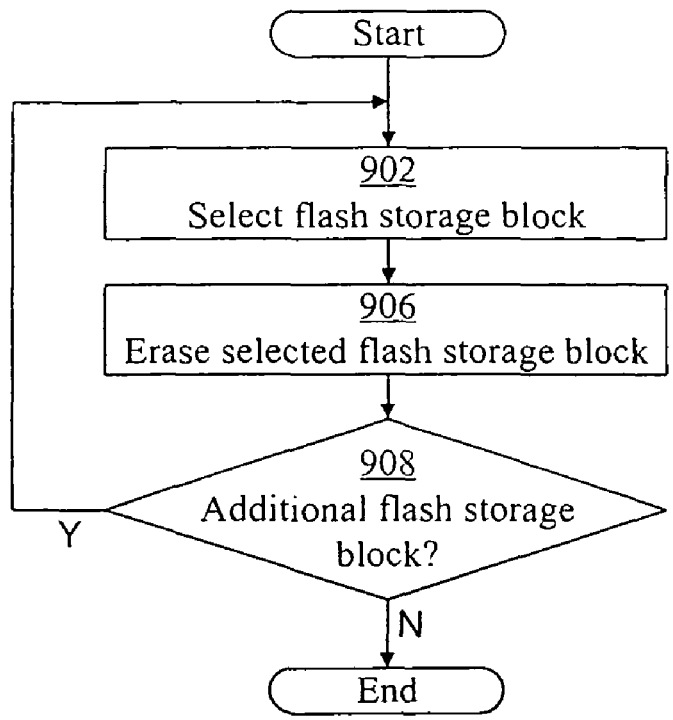
FIG. 9 is a flow chart for a portion of the method of purging the flash storage device, in accordance with one embodiment.

FIG. 9 illustrates a portion of the method 800 of purging the flash storage device 105, in accordance with one embodiment. The portion of the method 800 shown in FIG. 9 is a process 900 for erasing one of the flash storage units 125 in response to receiving a command. In this embodiment, each flash storage unit 125 performs the process 900 independently such that the processes 900 overlap each other. In this way, the flash storage units 125 perform the processes 900 substantially in parallel with each other. The process 900 is described below for one of the flash controllers 120 and the flash storage unit 125 corresponding to the flash controller 120.

In step 902, the flash controller 120 corresponding to the flash storage unit 125 selects a flash storage block 200 in the flash storage unit 125 for erasure. The selected flash storage block 200 can be a data block, a control block, a defective block, or a spare block. In one embodiment, each flash storage block 200 in the flash storage unit 125 is identified by a block address, and the flash controller 120, selects a flash storage block 200 having the lowest block address which has not yet been erased in the process 900. The method then proceeds to step 906.

In step 906, the flash controller 120 erases the selected flash storage block 200. In one embodiment, the flash controller 120 sends a signal to the selected flash storage block 200, and the selected flash storage block 200 is erased in response to the signal. For example, the selected flash storage block 200 may set each data bit in each location of the selected flash storage block 200 to a value of one in response to receiving the signal. In another embodiment, the flash controller 120 writes a data pattern into the selected flash storage block 200. For example, the selected flash storage block 200 may have locations each having eight data bits, and the flash controller 120 can write the value 0xFF into each location of the selected flash storage block 200. The method then proceeds to step 908.

In step 908, the flash controller 120 determines whether an additional flash storage block 200 in the flash storage unit 125 is to be erased. In one embodiment, the flash controller 120 erases each storage block 200 in the flash storage unit 125. In this embodiment, the flash controller 120 determines that an additional flash storage block 200 in the flash storage unit 125 is to be erased if not all flash storage blocks 200 in the flash storage unit 125 have been erased in the process 900. If an additional flash storage block 200 in the flash storage unit 125 is to be erased, the process 900 returns to step 902, otherwise the process 900 ends.

In embodiments where data patterns are written to the selected flash storage blocks 200, it is to be understood that the invention is not limited by the number of times the data pattern is written, or the value of the data pattern. The data patterns may be written 1, 2, 3, 4, 5, 6 or more times in the flash storage blocks 200, and the data patterns may change, be selected at run-time, or be selected randomly.

Figure 10:
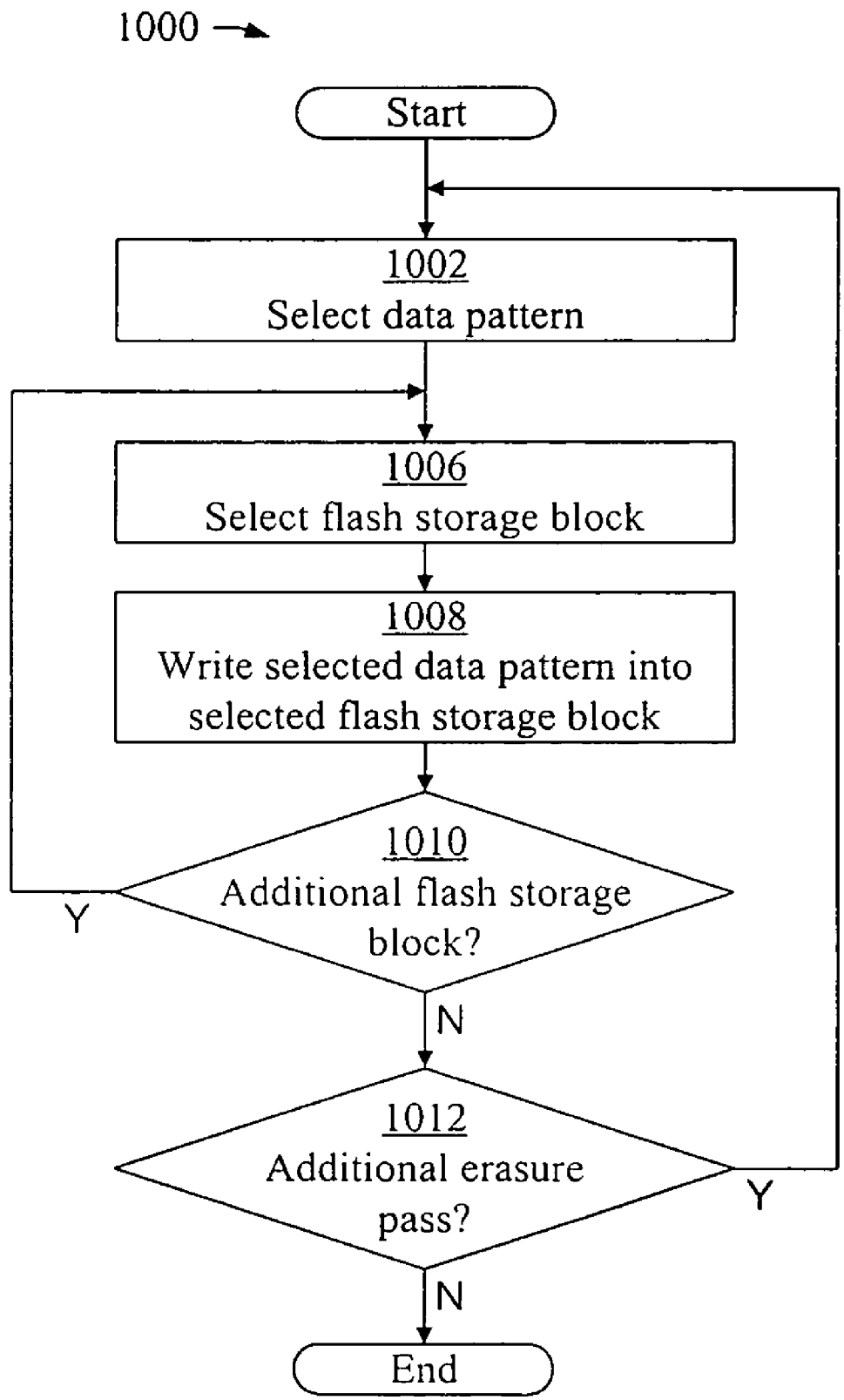
FIG. 10 is a flow chart for a portion of the method of purging the flash storage device, in accordance with one embodiment.

FIG. 10 illustrates a portion of the method 800 of purging the flash storage device 105, in accordance with one embodiment. The portion of the method 800 shown in FIG. 10 is a process 1000 for erasing one of the flash storage units 125 in response to receiving a command. In this embodiment, each flash storage unit 125 performs the process 1000 independently such that the processes 1000 overlap each other. In this way, the flash storage units 125 perform the processes 1000 substantially in parallel. The process 1000 is described below for one of the flash controllers 120 and the flash storage unit 125 corresponding to the flash controller 120.

In step 1002 a data pattern is selected for an erasure pass. In an erasure pass, the flash controller 120 writes a data pattern into each flash storage block 200 of the flash storage unit 125. In one embodiment, the flash controller 120 selects the data pattern from a predetermined sequence of data patterns. For example, the predetermined sequence of data patterns may include the sequence of values 0x00, 0xFF, and 0xA5 to be successively written into locations having eight data bits in the flash storage unit 125. In this example, the data pattern having the value 0x00 is selected for a first pass, the data pattern having the value 0xFF is selected for a second pass, and the data pattern having the value 0xA5 is selected for a third pass. The predetermined sequence of data patterns may have other values in other embodiments. The method then proceeds to step 1006. In other embodiments, the values and the sequence of values may be selected in another order or randomly.

In step 1006, the flash storage controller 120 selects a flash storage block 200 in the flash storage unit 125. The flash storage controller 120 selects the flash storage block 200 in the flash storage unit 125 that has not yet been erased in the process 1000. In one embodiment, each flash storage block 200 in the flash storage unit 125 is identified by a block address, and the flash controller 120 selects the flash storage block 200 having the lowest block address which has not yet been erased in the process 1000. The process 1000 then proceeds to step 1008.

In step 1008, the flash controller 120 writes the selected data pattern into the selected flash storage block 200. In one embodiment, the flash controller 120 writes the selected data pattern into the selected flash storage block 200 by writing the selected data pattern into each location of the selected flash storage block 200. The process 1000 then proceeds to step 1010.

In step 1010, the flash controller 120 determines whether an additional flash storage block 200 in the flash storage unit 125 is to be erased. In one embodiment, the flash controller 120 determines that an additional flash storage block 200 in the flash storage unit 125 is to be erased if not all data blocks in the flash storage unit 125 have been erased in the process 1000. If an additional flash storage block 200 in the flash storage unit 125 is to be erased, the process 1000 returns to step 1006, otherwise the process proceeds to step 1012.

In step 1012, the flash controller 120 determines whether an additional erasure pass is to be performed. In one embodiment, the flash controller 120 determines whether an additional erasure pass is to be performed based on the predetermined sequence of data patterns. If an additional data pattern remains to be selected in the sequence of data patterns, the flash controller 120 determines that an additional erasure pass is to be performed. If an additional erasure pass is to be performed, the process 1000 returns to step 1002, otherwise the process 1000 ends.

Figure 11:
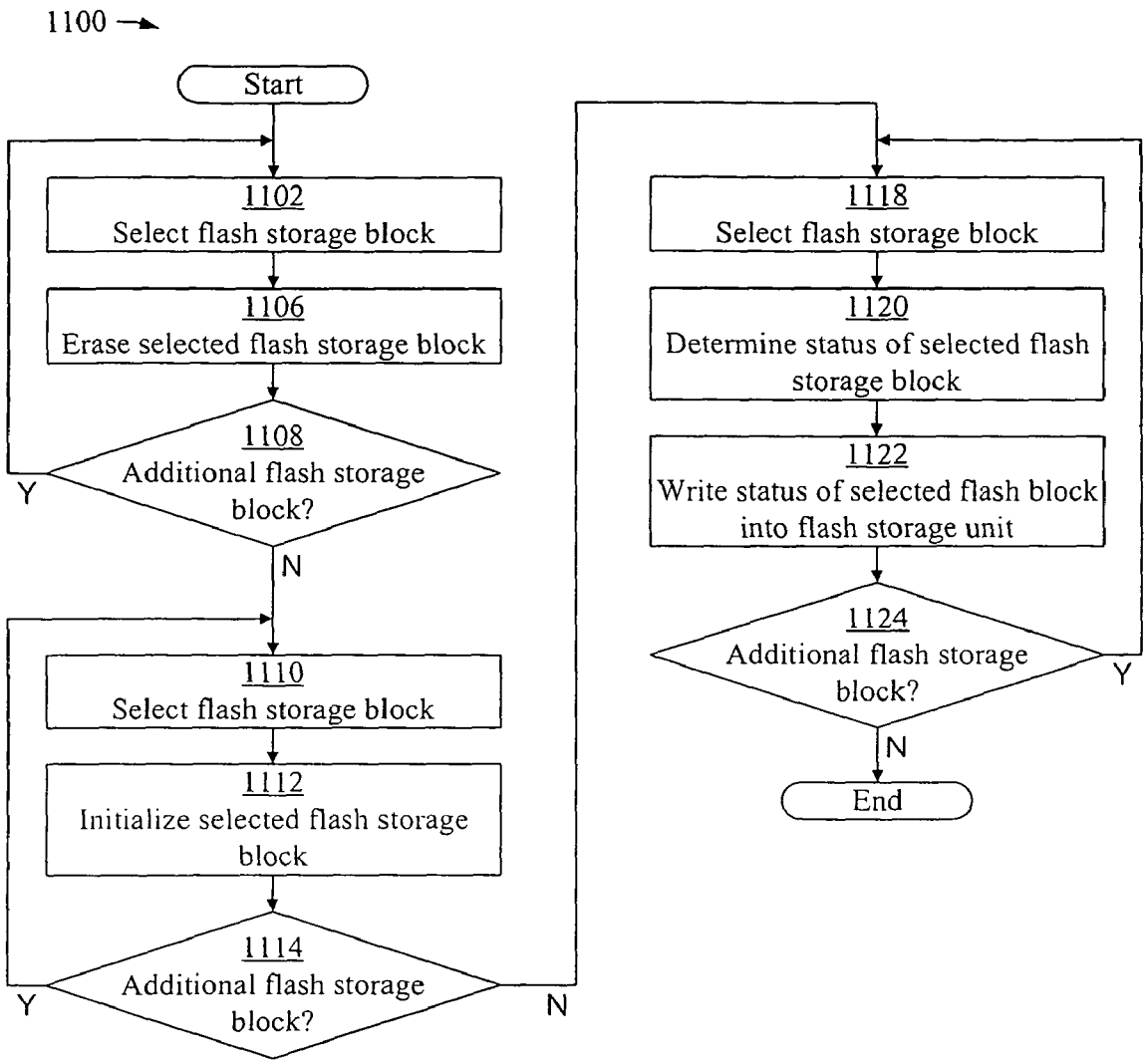
FIG. 11 is a flow chart for a portion of the method of purging the flash storage device, in accordance with one embodiment.

FIG. 11 illustrates a portion of the method 800 of purging the flash storage device 105, in accordance with one embodiment. The portion of the method 800 shown in FIG. 11 is a process 1100 for erasing one of the flash storage units 125 in response to receiving a command. In this embodiment, each flash storage unit 125 performs the process 1100 independently such that the processes 1100 may overlap each other. In this way, the flash storage units 125 perform the processes substantially in parallel. The process 1100 is described below for one of the flash controllers 120 and the flash storage unit 125 corresponding to the flash controller 120.

In step 1102, the flash controller 120 corresponding to the flash storage unit 125 selects a flash storage block 200 in the flash storage unit 125 for erasure. The selected flash storage block 200 may be a data block, a control block, or a spare block. In one embodiment, each flash storage block 200 in the flash storage unit 125 is identified by a block address. In this embodiment, the flash controller 120 selects a flash storage block 200 having the lowest block address which has not yet been erased in the process 1100 and which is a data block, a control block, or a spare block. The method then proceeds to step 1106.

In step 1106, the flash controller 120 erases the selected flash storage block 200. In one embodiment, the flash controller 120 sends a signal to the selected flash storage block 200, and the selected flash storage block 200 is erased in response to receiving the signal. For example, the selected flash storage block 200 may set each data bit in each location of the selected flash storage block 200 to a value of one in response to receiving the signal. In another embodiment, the flash controller 120 writes a data pattern into the selected flash storage block 200. For example, the selected flash storage block 200 may have locations each having eight data bits, and the flash controller 120 can write the value 0xFF into each location of the selected flash storage block 200. The method then proceeds to step 1108.

In step 1108, the flash controller 120 determines whether an additional flash storage block 200 in the flash storage unit 125 is to be erased. In one embodiment, the flash controller 120 determines that an additional flash storage block 200 in the flash storage unit 125 is to be erased if not all data blocks, control blocks, and spare blocks in the flash storage unit 125 have been erased in the process 1100. If an additional flash storage block 200 in the flash storage unit 125 is to be erased, the process 1100 returns to step 1102, otherwise the process 1100 proceeds to step 1110.

In step 1110, the flash controller 120 selects a flash storage block 200 in the flash storage unit 125 for initialization. The selected flash storage block 200 may be a data block, a control block, or a spare block among the flash storage blocks 200 in the flash storage unit 125. In one embodiment, each flash storage block 200 in the flash storage unit 125 is identified by a block address. In this embodiment, the flash controller 120 selects a flash storage block 200 in the flash storage unit 125 having the lowest block address which has not yet been erased in the process 1100 and which is a data block, a control block, or a spare block. The method then proceeds to step 1112.

In step 1112, the flash controller 120 initializes the selected flash storage block 200. In one embodiment, the flash controller 120 initializes the elected flash storage block 200 by initializing each control section 405 or 605 (FIG. 4 or FIG. 6) of each memory page 300 (FIG. 4 or FIG. 6) in the flash storage block 200. For example, the flash controller 120 can store status information for each memory page 300 into the control section 405 or 605 of the memory page 300. Also, the flash controller 120 can generate an error correction code for each memory page 300, or other data relating to the memory page 300, and writes the error correction code into the control section 405 or 605 of the memory page 300. The process 1100 then proceeds to step 1114.

In step 1114, the flash controller 120 determines whether an additional flash storage block 200 in the flash storage unit 125 is to be initialized. In one embodiment, the flash controller 120 determines that an additional flash storage block 200 in the flash storage unit 125 is to be initialized if not all data blocks, control blocks, and spare blocks in the flash storage unit 125 have been initialized in the process 1100. If an additional flash storage block 200 in the flash storage unit 125 is to be initialized, the process 1100 returns to step 1110, otherwise the process 1100 proceeds to step 1118.

In step 1118, the flash controller 120 selects a flash storage block 200 in the flash storage unit 125. The selected flash storage block 200 may be a data block, a control block, a spare block, or a defective block. In one embodiment, each flash storage block 200 in the flash storage unit 125 is identified by a block address. In this embodiment, the flash controller 120 selects a flash storage block 200 in the flash storage unit 125 having the lowest block address which is a data block, a control block, a spare block, or a defective block. The method then proceeds to step 1120.

In step 1120, the flash controller 120 determines a status 705 for the selected flash storage block 200. The flash controller 120 may determine the status of the selected flash storage block 200 based on a flag in a block header of the flash storage block 200, a table indicating a block type (e.g., a data block or control block) of the flash storage block 200, the location of the flash storage block 200 in the flash storage unit 115, or by another method. In one embodiment, the flash controller 120 determines the status 705 of a flash storage block 200 that is a defective block based on the content of the flash storage block 200. For example, the flash storage block 200 may contain the value zero in each location of the flash storage block 200 indicating that the flash storage block 200 is a defective block. The method then proceeds to step 1122.

In step 1122, the flash controller 120 writes a status 705 of the selected flash storage block 200 into the flash storage unit 125. In one embodiment, the flash controller 120 writes the status 705 of the identified flash storage block 200 into another flash storage block 200 of the flash storage unit 115 that is a control block. In a further embodiment, the flash controller 120 writes the status 705 of the identified flash storage block 200 into a block status table 700 which is stored in the control block. In other embodiments, the flash controller 120 writes the status 705 of the identified flash storage block into a flash storage block 200 other than a control block. Moreover, the block status table 700 may be stored in a flash storage block 200 other than a control block. The process 1100 then proceeds to step 1124.

In step 1124, the flash controller 120 determines whether a status 705 is to be determined for an additional flash storage block 200 in the flash storage unit 125. In one embodiment, the flash controller 120 determines that a status 705 is to be determined for an additional flash storage block 200 based on the block status table 700 of the flash storage unit 125. If the block status table 700 of the flash storage unit 125 does not contain a status 705 for each flash storage block 200 in the flash storage unit 125, the flash controller 120 determines that a status is to be determined for an additional flash storage block 200 in the flash storage unit 125. If a status is to be determined for an additional flash storage block 200 in the flash storage unit 125, the process 1100 returns to step 1118, otherwise the process ends. In some embodiments, the block status table 700 of the flash storage unit 125 does not contain a status 705 for each flash storage block 200, but only for a certain portion as appropriate in the embodiment.

In some embodiments, it would be advantageous to verify the results of the purge operation of the flash storage device 105. Verification may take place through various methods or systems, and the invention is not limited by a particular type of verification. Moreover, in some embodiments, verification does not occur or is optional. Verification may also take place in a laboratory or manufacturing setting, or in the field where the flash storage device 105 is used. Thus, verification may occur soon after the purge is complete, or some time after the completion of the purge.

In embodiments where the control blocks (including locations used by control. electronics and those blocks originally marked as "bad" by manufacturer) of the flash storage units 125 have been erased, verification maybe made by making a read or write request to or within the flash storage device. Such a request should return an error message, such as an abort error, if the flash storage device 105 has been purged. In this scenario, for example, the error (e.g. abort error) verifies the purge.

In embodiments where the marked bad blocks (e.g. manufacturer's marked bad blocks) or their locations have been purged, for verification purposes the flash storage device would be reinitialized and a format executed. The purge would then be verified by comparing the data on the flash storage device against the desired pattern after the purge, such as a fixed 0x00 pattern. In the example of the 0x00 pattern, inverted data is returned when the flash storage device is erased in an all 0xFF pattern. Another verification may be made by dismantling the flash storage device and placing the flash storage unit 125, along with other required components, into a device programmer. Thereafter, a successful execution of a blank check on the parts verifies that proper erasure occurred.

In embodiments where a data pattern is written to the selected flash storage block 200, the purge is verified by reading the contents of the flash storage unit 125 and comparing the results with the final data pattern written. A match would verify that the purge was successful. In these embodiments, verification of the intermediate data patterns may be performed by using debugger tools. The debugger may interrupt the purge process and internally verify the intermediate data patterns.

In embodiments where the drive is functional at the end of the purge process, for example where the control blocks are maintained or recreated, a full data comparison with an erased data pattern, such as 0x00, verifies the successful purge of the flash storage device 105.

Although the invention has been described with reference to particular embodiments thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for purging a flash storage device comprising a plurality of flash storage units, each flash storage unit comprising a plurality of flash storage blocks comprising at least one data block for storing user data and at least one control block for storing control data for the flash storage unit, the method comprising:
   receiving a first command; and
   erasing the plurality of flash storage units substantially in parallel in response to receiving the first command,
   wherein erasing the plurality of flash storage units comprises successively writing a plurality of data patterns into each data block of each of the plurality of flash storage units.

2. The method of claim 1, wherein writing the plurality of data patterns into each data block of each flash storage block in the plurality of flash storage units comprises:
   writing a first data pattern into each data block of each flash storage unit in the plurality of flash storage units;
   writing a second data pattern into each data block of each flash storage unit of the plurality of flash storage units; and
   writing a third data pattern into each data block of each flash storage unit of the plurality of flash storage units.

3. The method of claim 2, wherein the first data pattern comprising a value of OxOO, the second data pattern comprising a value of OxFF, and the third data pattern comprising a value of OxA5.

4. The method of claim 1, further comprising generating the first command based on a condition of the flash storage device.

5. A system comprising:
   a plurality of flash storage units, each flash storage unit comprising a plurality of flash storage blocks comprising at least one data block for storing user data and at least one control block for storing control data for the flash storage unit; and
   a plurality of flash storage controllers, each flash storage controller of the plurality of flash storage controllers coupled in communication with a corresponding flash storage unit of the plurality of flash storage units, the plurality of flash storage controllers configured to receive a first command and to erase the plurality of flash storage units substantially in parallel in response to receiving the first command,
   wherein each flash storage controller is further configured to erase the flash storage unit corresponding to the flash storage controller by successively writing a plurality of data patterns into each of the at least one data block.

6. The system of claim 5, further comprising a flash controller interface configured to receive the first command and provide the first command to each flash storage controller of the plurality of flash storage controllers.

7. The system of claim 5, further comprising a flash controller interface configured to receive a second command for purging the plurality of flash storage units, generate the first command based on the second command, and to provide the first command to each flash storage controller of the plurality of flash storage controllers.

8. The system of claim 5, wherein each flash controller of the plurality of flash controllers is further configured to erase the at least one data block in the flash storage unit corresponding to the flash controller by successively writing a first data pattern, a second data pattern, and a third data pattern into each data block of the at least one data block.

9. The system of claim 8, the first data pattern comprises a value of OxOO, the second data pattern comprises a value of OxFF, and the third data pattern comprises a value of OxA5.

10. The system of claim 5, wherein the plurality of flash storage blocks in at least one flash storage unit of the plurality of flash storage units further comprises at least one spare block, and wherein the flash controller corresponding to the flash storage unit comprising the at least one spare block is further configured to erase the at least one spare block in response to receiving the first command.

11. The system of claim 10, wherein the plurality of flash storage blocks in at least one flash storage unit of the plurality of flash storage units further comprises at least one defective block.

12. The system of claim 6, further comprising a processor coupled to the flash controller interface and configured to generate the first command.

13. The system of claim 12, wherein the processor is further configured to generate the first command based on a condition of the system.

14. A system for purging a flash storage device comprising a plurality of flash storage units, each flash storage unit comprising a plurality of flash storage blocks comprising at least one data block for storing user data and at least one control block for storing control data for the flash storage unit, the system comprising:

means for receiving a first command; and means for erasing the plurality of flash storage units substantially in parallel in response to receiving the first command, wherein erasing the plurality of flash storage units comprises successively writing a plurality of data patterns into each of the at least one data block of each of the plurality of flash storage units.

* * * * *